US007256717B2

(12) United States Patent
Piret et al.

(10) Patent No.: US 7,256,717 B2
(45) Date of Patent: Aug. 14, 2007

(54) METHOD FOR THE ENCODING AND DECODING OF A SEQUENCE OF WORDS, CORRESPONDING SIGNAL, ENCODER, DECODER, COMPUTER PROGRAMS AND STORAGE MEANS

(75) Inventors: Philippe Piret, Cesson-Sévigné (FR); Arnaud Closset, Cesson-Sévigné (FR); Laurent Frouin, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/179,623

(22) Filed: Jul. 13, 2005

(65) Prior Publication Data
US 2006/0028361 A1    Feb. 9, 2006

(30) Foreign Application Priority Data
Jul. 22, 2004    (FR) .................................. 04 08144

(51) Int. Cl.
*H03M 5/00*    (2006.01)
(52) U.S. Cl. .......................................... 341/58; 341/50
(58) Field of Classification Search ........... 341/50–100
See application file for complete search history.

(56) References Cited

U.S. PATENT DOCUMENTS

| 4,486,739 | A |   | 12/1984 | Franaszek et al. ........... 340/347 |
| 5,652,582 | A | * | 7/1997  | Truong et al. ................. 341/65 |
| 5,905,739 | A |   | 5/1999  | Piret et al. ................. 371/37.01 |
| 6,543,021 | B1 |  | 4/2003  | Piret .......................... 714/752 |
| 6,578,170 | B1 |  | 6/2003  | Piret et al. .................. 714/758 |
| 6,578,171 | B1 |  | 6/2003  | Braneci et al. ............. 714/786 |
| 6,638,318 | B1 |  | 10/2003 | Piret et al. .................. 718/781 |
| 6,766,489 | B1 |  | 7/2004  | Piret .......................... 714/755 |
| 6,910,006 | B2 |  | 6/2005  | Piret .......................... 704/203 |
| 6,993,698 | B2 |  | 1/2006  | Piret .......................... 714/755 |
| 7,069,492 | B2 |  | 6/2006  | Piret et al. .................. 714/755 |

(Continued)

FOREIGN PATENT DOCUMENTS

| EP | 1 047 197 A2 | 10/2000 |
| EP | 1 187 335 A2 | 3/2002 |

OTHER PUBLICATIONS

Maes, et al., "Digital Audio Technology", Focal Press, XP002321551, pp. 127-130, 2001, no month.
Hollmann, et al., "Performance of Efficient Balanced Codes", IEEE Transaction on Information Theory, vol. 37, No. 3, pp. 913-918, May 1, 1991.

(Continued)

*Primary Examiner*—Lam T. Mai
(74) *Attorney, Agent, or Firm*—Fitzpatrick, Cella, Harper & Scinto

(57) ABSTRACT

A method for encoding and decoding a sequence of words, corresponding signal, encoder, decoder, computer programs and storage means. A method for encoding a sequence of source words includes a step of selecting an encoding function to be applied to a source word to be encoded as a function of the content of the word to be encoded and of at least one preceding source word in the sequence so that the concatenation of two consecutive encoded words has no binary element, called an isolated binary element, sandwiched between two binary elements with a value different from that of the isolated binary element. The method further includes a step of encoding the word to be encoded implementing the selected encoding function.

26 Claims, 6 Drawing Sheets

| $a$ | $L_0^+$ |
|---|---|
| 0 | 0 0 1 1 1 1 1 1 1 0 0 0 0 0 |
| 1 | 0 1 1 1 1 1 1 1 0 0 0 0 0 0 |
| 2 | 0 1 1 1 1 1 0 0 1 1 0 0 0 0 |
| ... | |
| 69 | 0 1 1 0 0 0 0 1 1 1 1 0 0 1 |
| ... | |
| 89 | 0 0 0 0 0 0 0 1 1 1 1 1 1 1 |
| ... | |
| 254 | 0 0 0 0 1 1 1 1 1 1 1 1 1 1 |
| 255 | 0 0 1 1 1 1 1 1 1 1 0 0 1 1 |

251

U.S. PATENT DOCUMENTS

| | | | |
|---|---|---|---|
| 2004/0117719 A1 | 6/2004 | Lehobey et al. | 714/781 |
| 2004/0194006 A1 | 9/2004 | Piret et al. | 714/800 |
| 2005/0015704 A1 | 1/2005 | Piret et al. | 714/781 |
| 2005/0138533 A1 | 6/2005 | Le Bars et al. | 714/784 |
| 2005/0188291 A1 | 8/2005 | Piret et al. | 714/752 |
| 2005/0204268 A1 | 9/2005 | Piret et al. | 714/781 |
| 2005/0257115 A1 | 11/2005 | Piret et al. | 714/752 |
| 2006/0038707 A1 | 2/2006 | Walker et al. | 341/50 |

OTHER PUBLICATIONS

Schouhamer, "EFMPlus: The Coding Format of the Multimedia Compact Disc", IEEE Transactions on Consumer Electronics, vol. 41, No. 3, pp. 491-497, Aug. 1, 1995.

A.X. Widmer, et al., "A DC-Balanced, Partitioned-Block, 8B/10B Transmission Code", IBM Journal of Research and Development, vol. 27, No. 5, pp. 440-451, Sep. 1983.

* cited by examiner

| $a$ | $L_0^+$ |
|---|---|
| 0 | 0 0 1 1 1 1 1 1 0 0 0 0 0 |
| 1 | 0 1 1 1 1 1 1 1 0 0 0 0 0 |
| 2 | 0 1 1 1 1 1 0 0 1 1 0 0 0 0 |
| ... | |
| 69 | 0 1 1 0 0 0 0 1 1 1 1 0 0 1 |
| ... | |
| 89 | 0 0 0 0 0 0 0 1 1 1 1 1 1 |
| ... | |
| 254 | 0 0 0 0 1 1 1 1 1 1 1 1 1 |
| 255 | 0 0 1 1 1 1 1 1 1 1 0 0 1 1 |

METHOD FOR THE ENCODING AND DECODING OF A SEQUENCE OF WORDS, CORRESPONDING SIGNAL, ENCODER, DECODER, COMPUTER PROGRAMS AND STORAGE MEANS

BACKGROUND OF THE INVENTION

1. Field of the Invention

This invention relates to the field of telecommunications

More precisely, the invention proposes a device and a method of encoding and decoding suited especially to a wire high-speed data transmission, particularly in a home or office environment.

2. Description of the Prior Art

Certain constraints have to be met during the data-sending and data-transmission phase for data transmission applications in interior and exterior environments. These constraints particularly limit the radiation spectrum. They are applicable particularly to transmission in a home or office environment. Thus, according to the prevailing standards of electromagnetic compatibility, the radiation spectrum must remain within a jig that restricts the radiation to within 30 MHz. Certain encoding methods are used for data transmission in an intra-building environment, particularly in order to limit radiation to within 30 MHz, while maintaining a high bit rate or speed.

Thus a first encoding system, the MLT3 (MulTiLevel 3) encoding system more particularly described in the IEEE802.3 standard, is used for example in 100BaseT type interfaces. In this encoding system, bits equal to "1" correspond to a transition, while bits equal to "0" correspond to an absence of transition. Thus, only bits equal to "1" will cause a change in the state signal. They are encoded successively on three states such as, for example, –V, 0, +V. Bits equal to "0" are encoded, for their part, in retaining the previously transmitted value.

The main advantage of the MLT3 encoding system is that it greatly reduces the frequency necessary for a given speed or bit rate, due to the use of three states. For example, for a bit rate of about 100 Mbits/s, the maximum parasite frequency of the signal is about 25 MHz.

One major disadvantage of this encoding system is caused by the long sequences of "0" bits that appear in this code and that can cause a loss or a phase shift of the receiver clock. To overcome this problem, encoded pieces of data are scrambled before being transmitted. This diminishes the improvements given by this code.

Moreover, since the Hamming distance between valid code words is very small (equal to one), transmission errors are facilitated, as errors might occur in encoding or in scrambling. There is then a risk of accepting invalid code words or rejecting valid code words.

Finally, this code makes it difficult to control the radiation spectrum and does not have particularly worthwhile error detection or error correction properties.

The prior art also envisages other encoding methods to obtain a radiation spectrum that partly meet the requirement of limiting radiation to within 30 MHz.

These encoding methods can be used to cancel the DC component of data to be transmitted, taken as an average or for each symbol transmitted.

The cancellation of this DC component (also known as DC balancing or direct-component balancing), provides a means of obtaining a radiation spectrum partly complying with a jig laid down by intra-building transmission standards, limiting radiation to within 30 MHz.

For example, one such method uses the Widmer and Franaszek encoding (A. X. Widmer and P. A Franaszek, IBM Journal of Research and Development, Vol. 27 No. 5, p. 440, September 1983), used in the IEEE 1394b standard. This encoding gives 10-bit words from 8-bit words, using a DC balancing technique.

This technique cancels the average DC component, and not the DC component for each transmitted symbol.

However, it has the disadvantage of permitting successive transitions. The result is non-negligible radiation beyond 30 MHz. The spectrum then does not fully comply with the jig laid down in frequency emission standards. Therefore this code only partially meets the specified constraints.

SUMMARY OF THE INVENTION

The invention with its various aspects is intended especially to overcome these drawbacks of the prior art.

More precisely, one goal of the invention is to provide a method of encoding for data transmission by which a signal can be transmitted while limiting radiation during sending and by which a clock signal can be reconstructed from a received data signal.

In particular, in the case of wire transmission, it is a goal of the invention to provide such a method of limiting radiation and attenuation in transmission wires, and particularly in cables.

Another goal of the invention is to provide an encoding method of this kind that enables data transmission at high bit rates.

It is also a goal of the invention to propose a low-cost method that can be easily implemented in sending and in reception.

These goals, and others that shall appear here below, are achieved by means of a method for the encoding of a sequence of source words.

According to the invention, an encoding method of this kind comprises a step for the selection of an encoding function to be applied to a source word to be encoded as a function of the content of the word to be encoded and of at least one preceding source word in the sequence so that the concatenation of two consecutive encoded words has no binary element, called an isolated binary element, sandwiched between two binary elements with a value different from that of the isolated binary element. This method also comprises a step for the encoding of the word to be encoded implementing the selected encoding function.

According to a preferred embodiment of the invention, a word is a sequence of binary elements, and a sequence of words results from a concatenation of words.

Thus the invention limits the number of isolated binary elements not only within one encoded word but also in any sequence of encoded words. Thus, the spectrum of a sent signal corresponding to a sequence of encoded word is reduced for a given transmission speed. However, it is always possible to retrieve the transmission clock signal from the signal sent by an encoder and then received by a decoder, since transitions may appear every 2, 3, 4 . . . binary elements in a sequence of encoded words.

Advantageously, said step for the encoding of said word to be encoded produces an encoded word with a fixed length depending on the length of the word to be encoded.

Preferably, said step for the selection of an encoding function takes account of said binary element of the last encoded word, the first binary element of the result of the application of said encoding function to said source sequence to be encoded being equal to said binary element of the last encoded word.

Thus, the implementation of the encoding method according to the invention is particularly simple.

In particular, the encoding method may include a step for the storage of the last binary element of the last encoded word.

Advantageously, the encoding method comprises a step to compute the difference between a number of binary elements associated with a first binary value and a number of binary elements associated with a second binary value, said binary elements belonging to a set of previously encoded words. According to the invention, the step for selecting an encoding function takes account of the result of said computation so as to approximately balance the number of binary elements respectively associated with the first and second binary values, and the binary elements belong to a set of words encoded after application of said encoding function.

Thus, the number of binary elements respectively associated with a first value (for example 0) and a second value (for example 1) is balanced, the weight of a sequence being close to half its length.

This method eliminates (or at least restricts) the presence of a DC component in a signal corresponding to an encoded sequence.

The cancellation of this DC component (also known as DC balancing or direct component balancing), provides a means of obtaining a radiation spectrum that partly complies with a jig laid down by transmission standards in limiting radiation.

Preferably, said step for the selection of an encoding function takes account of the sign of said difference.

In particular, the application of the encoding function, selected during said selection step, to said source word to be encoded:

contains at least as many elements corresponding to said first binary value as elements corresponding to the said second binary value if said difference is strictly negative; and contains at most as many elements corresponding to said first binary value as elements corresponding to said second binary value if said difference is strictly positive.

In this way, the encoding of each word provides for a simple balancing of a sequence of encoded words.

Advantageously, said step for the selection of an encoding function comprises a selection of an encoding function from among:

a first predetermined encoding function whose result is an encoded sequence with a weight, called a mean weight, greater than or equal to half the number of elements of the encoded word and whose first element has a first binary value representing 0;

a second predetermined encoding function whose result is an encoded word with a weight lower than or equal to said mean weight, and whose first element possesses a first binary value representing 0;

a third predetermined encoding function whose result is an encoded word with a weight greater than or equal to said mean weight, and whose first element has a first binary value representing 1;

a fourth predetermined encoding function whose result is an encoded word with a weight lower than or equal to said mean weight, and whose first element has a first binary value representing 1.

Thus, with a limited number of encoding functions, the invention meets the requirement of the absence of isolated binary elements in a word as well as that of the balancing of elements in a sequence of words.

In particular, the first and second encoding functions coincide when each of them produces encoded words with a weight equal to the mean weight and the third and fourth functions coincide when each of them produces an encoded word with a weight equal to the mean weight.

The term "coincide" refers to the fact that two encoding functions are such that if two encoded words with a weight equal to said mean weight, respectively produced by each of the two encoding functions from a first source word and a second source word respectively, are identical, then said first and second source words are identical.

In this way, the encoded words having a weight equal to the mean weight are relatively simple to decode since they can be decoded without distinction by the first or second encoding function (and third or fourth function respectively) when their first binary element has a first binary value representing 0 (or 1 respectively).

The encoding method comprises especially a step for the storage of a first encoding table associated with the first encoding function and a second encoding table associated with the second encoding function, and a step for the reading of an encoded sequence in one of said encoding tables associated with the selected encoding function if one of the first or second encoding functions is selected.

Thus, the implementation of the encoding method requires little computing capacity while remaining simple to implement.

Preferably, at least one of said encoding functions comprises a step for determining the binary complement of the word to be encoded.

In this way, it is possible to reduce the memory size necessary for the encoding and, especially, to take account of symmetry between a word to be encoded and its complement, the two encoded words being advantageously complementary.

The invention also relates to a method for the decoding of a sequence of binary encoded words.

According to the invention, the sequence does not possess a binary element, known as an isolated binary element, sandwiched by two binary elements with a value different from that of said isolated binary element, and the decoding method comprises a step for the decoding of each of the binary encoded words, the binary encoded words being decoded separately.

Advantageously, all the binary encoded words have the same determined length.

Thus, the invention is particularly well suited to a decoding of a signal whose spectrum is limited. At the same time it can be used to perform a decoding that is simple to implement.

Preferably, for each of the binary encoded words, the decoding method comprises a step for reading a decoded word in a decoding table at a position that depends on the encoded word, and a step for checking the validity of the decoded word according to the result of said reading step.

In this way, the decoding is particularly simple to implement, while providing for the detection of a transmission error of an encoded word when the decoding table reading operation returns an aberrant value or a specific error signal.

For each of the binary encoded words, the decoding method also comprises a step for checking the validity of said received word according to the previously received words of said sequence.

Advantageously, for each of the binary encoded words, the decoding method comprises, a step for selecting a decoding function to be applied to the binary encoded word according to the content of said encoded word.

Thus, the decoding enables the simple identification of the decoding function adapted to the encoded word.

In particular, the selection step may comprise a sub-step for the extraction of a sub-word from said binary encoded word.

A sub-word extracted from a word is herein an n-tuple containing a part of the binary elements of this word.

In this way, it is not necessary to read and/or process all the content of an encoded word to select a decoding function.

Furthermore, the decoding method may comprise a sub-step for determining the weight of said encoded binary word, and said sub-step for the extraction of the sub-sequence comprises a determining of the positions of the binary elements extracted from the said binary encoded word according to said weight.

Thus, by a simple computation of the weight of an encoded word, the positions of the binary elements to be extracted are selected, thus leaving greater freedom in the choice of the codes that can be used according to the invention, while limiting the number of binary elements to be extracted.

In particular, the method comprises a step for the computation of a linear combination of the binary elements of said sub-word, and a step for reading a decoding table according to said linear combination.

Thus, a simple computation of a linear combination of the binary elements of the sub-word can be used to directly obtain a decoded word by a reading of the decoding table.

Preferably, for each of the binary encoded words, the decoding method comprises a step for the identification of the first binary element of said binary encoded word, and a step for the computation of the binary complement of said binary encoded word if said first binary element corresponds to a predetermined value.

Thus, the decoding method according to the invention takes account of the symmetries between an encoded word and its complement to simplify the implementation of the method and, more particularly, to economize on memory.

Advantageously, for each of said binary encoded words, the method comprises a step to check the validity of said encoded word according to the weight of said encoded word.

Indeed, the weights of the encoded words are preferably close to the mean weight. If the received weight is too high or too low, a transmission error can easily be detected according to the invention.

The invention also relates to a signal representing a sequence of binary encoded words. This signal is remarkable in that said sequence does not possess a binary element, called an isolated binary element, sandwiched by two binary elements with a value different from that of said isolated binary element.

In particular, the weight of any sub-sequence of said sequence is smaller than a predetermined value.

The advantages of the devices, computer program products and computer readable storage medium are the same as those of the encoding and decoding methods. They are not described in greater detail.

BRIEF DESCRIPTION OF THE DRAWINGS

Other features and advantages of the invention shall appear more clearly from the following description of a preferred embodiment given by way of a simple illustrative and non-exhaustive example, and from the appended drawings, of which:

FIG. 3 presents a table implemented in the encoder of FIG. 2;

MORE DETAILED DESCRIPTION

Figure 1:
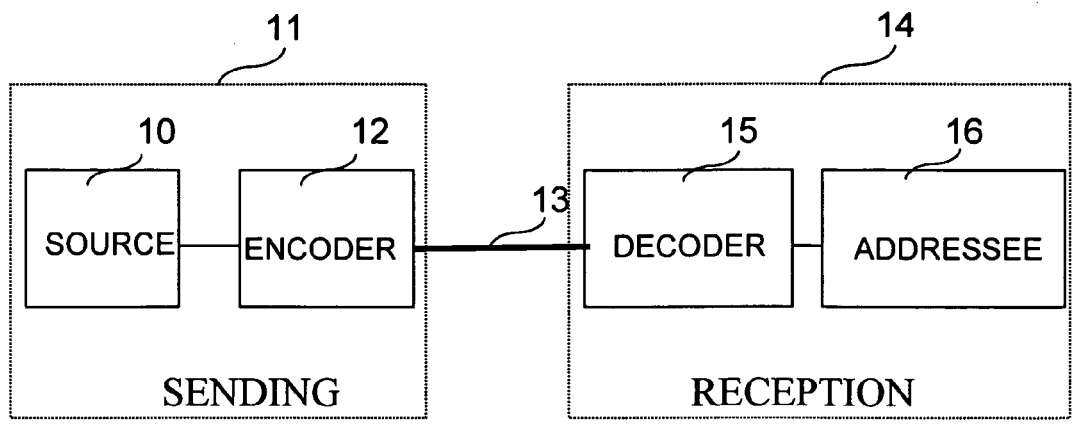
FIG. 1 presents the general principle of a system of encoding when sending and of decoding at reception according to the invention.

The general principle of the invention is based on the encoding of a source symbol (or word) as an encoded symbol, so that the encoded symbols are relatively balanced, i.e. so that their weight is neither low nor high and so that they have no isolated binary elements or bits.

A preferred embodiment of the invention considers source words referenced a, each containing eight binary elements referenced $a_i$ where i represents an integer ranging from 0 to 7 ($a=(a_0, a_1, \ldots a_7)$). The term "binary element" refers to an element of the alphabet $\{0, 1\}$. Each source word a is encoded to form a word x on the alphabet $\{-E, +E\}$, E corresponding to a signal amplitude equal, for example, to 1.

The encoding is such that an encoded sequence resulting from the concatenation of several words x, coming from an encoding of several source words a, remains decodable.

In order to facilitate the description of an embodiment, each of the words x is represented by a word y, with each of its components being replaced by an element on the alphabet $\{0, 1\}$, each of the components of y being equal to half the value of the corresponding component of x incremented by 1 ($y_i=(1+x_i)/2$).

Two types of problems arise in this context:

an excessively high frequency in the transitions $+1/-1$ (respectively 1/0) in a sequence of several words x (respectively y); and an imbalance between the number of 1s and of $-1$s in the sequence of several words x.

In order to overcome these problems, the encoding meets the following two conditions:

none of the sequences of words y contains any isolated bits (except possibly for the first or last symbol of each word) or, in other words, sub-words of the (0,1,0) or (1,0,1) type;

j being any unspecified positive or zero integer, the sum of the j first components of each sequence of words x is smaller, in terms of absolute value, than a positive integer M (for any value of $j \geq 0$, $$\left| \sum_{i=0}^{j} x_i \right| \leq M),$$

so that the sequences can be balanced (or in an equivalent way, the sum of the j first components of each sequence y is close to half of j, for j smaller than or equal to M).

It is clear that the method, known per se, which consists in encoding each component $a_i$ of a as a component $x_i$ of x, equal to $(-1)^{ai}$ does not meet these conditions.

According to another method that does not belong to the prior art, a word a is considered to be a resultant of the concatenation of homogeneous sub-words, i.e. sub-words containing only 0s or only 1s but not both. By way of an illustration, the word a equal to (0, 0, 1, 1, 0, 1, 1, 1) is considered to be the concatenation of the following four homogeneous sub-words: (0,0), (1,1), (0) and (1,1,1). According to this method, each homogeneous sub-word is extended or stretched by means of a symbol, the resulting word remaining homogeneous. Thus, a is first of all encoded as an intermediate word equal to (0, 0, 0, 1, 1, 1, 0, 0, 1, 1, 1). Then, in order to balance the word, symbols (known as padding symbols) are added at the end of an intermediate sequence so that there are as many 0s as they are 1s. The final word y is then equal to (0, 0, 0, 1, 1, 1, 0, 0, 1, 1, 1, 0, 0). This word y has a length that depends on a (in the example, this length is equal to 14). This method has the drawback of producing a code of variable length.

The distribution N(l) of length l of the 256 possible sequences y obtained by encoding of sequences a with a length 8 is given in the following table:

| l    | 10 | 12 | 14 | 16 | 18 |
|------|----|----|----|----|----|
| N(l) | 2  | 32 | 90 | 90 | 42 |

This method also has the drawback of having a relatively great mean length (equal to 15.0781 in the example).

However, it has the advantage of being relatively simple to decode, especially according to the following algorithm:
  each homogeneous sub-word of y is identified and then shortened by a symbol (with the elimination of the padding symbol of each sub-word) until eight symbols are obtained; then
  the first eight symbols thus obtained correspond to a source word a and are kept;
  the number of padding symbols is computed from these symbols and the corresponding symbols are eliminated (any symbols possibly added to the intermediate word are eliminated).

The process can be reiterated for each received sequence to be decoded.

The invention has the advantage of enabling a fixed code length.

According to a preferred embodiment of the invention, each word a in 8-tuple form is encoded as a binary 14-tuple. Thus, the length of each encoded word is fixed (equal to 14 according to the embodiment described) and smaller than the mean length (close to 15.1) of the previously described code.

The set L of 14-tuples containing no sub-word (0,1,0) or (1,0,1) is considered. The set L comprises 1220 14-tuples, corresponding to "right words". The set L comprises two subsets:
  one subset $L_0$ that comprises the 14-tuples whose first element is equal to 0; and
  one subset $L_1$ that comprises the 14-tuples whose first element is equal to 1.

Naturally, the subsets $L_0$ and $L_1$ are disjoined and possess the same number of 14-tuples, i.e. 610.

We consider $A_i(w)$ the number of bits of $L_i$ that have a Hamming weight (i.e. that have a number of bits with a value of 1) equal to w. The set of fifteen numbers $A_i(w)$ with w ranging from 0 to 14 ($0 \leq w \leq 14$) is called the "distribution of the weight of the set $L_i$".

The distribution of the weights of $L_0$ and $L_1$ is given in the following table:

| w        | 0 | 1 | 2  | 3  | 4  | 5  | 6   | 7   | 8   | 9  | 10 | 11 | 12 | 13 | 14 |
|----------|---|---|----|----|----|----|-----|-----|-----|----|----|----|----|----|----|
| $A_0(w)$ | 1 | 1 | 12 | 20 | 54 | 87 | 117 | 121 | 96  | 59 | 27 | 12 | 2  | 1  | 0  |
| $A_1(w)$ | 0 | 1 | 2  | 12 | 27 | 59 | 96  | 121 | 117 | 87 | 54 | 20 | 12 | 1  | 1  |

The first row of this table represents the possible values of the weight w, the second and third rows respectively represent the corresponding values of $A_0(w)$ and $A_1(w)$. Naturally, $A_0(w)$ is equal to $A_1(14-w)$.

The following quantities are computed:

$$\sum_{w=0}^{7} A_0(w) = \sum_{w=7}^{14} A_1(w) = 413,$$

$$\sum_{w=0}^{7} A_1(w) = \sum_{w=7}^{14} A_0(w) = 318,$$

Since the sum $\Sigma_{w=0}^{7} A_0(w)$ is greater than 256, the 256 binary 8-tuples a can be encoded as 256 different 14-tuples y that do not contain one of the sub-words (0, 1, 0) or (1, 0, 1), having a first bit equal to 0 and a weight lower than or equal to 7. Similarly, since the sum $\Sigma_{w=7}^{14} A_0(w)$ is also greater than 256, it is possible to encode all the binary 8-tuples a as different 14-tuples y that do not contain one of the sub-words (0, 1, 0) or (1, 0, 1), having a first bit equal to 0 and a weight greater than or equal to 7.

Similarly, since the sum $\Sigma_{w=0}^{7} A_0(w)$ is greater than 256, it is possible to encode all the binary 8-tuples a as different 14-tuples y that do not contain one of the sub-words (0, 1, 0) or (1, 0, 1), having a first bit equal to 1 and having a weight lower than or equal to 7. Similarly, when the sum $\Sigma_{w=7}^{14} A_1(w)$ is greater than 256, it is possible to encode each binary 8-tuple a as different 14-tuples y that do not contain one of the sub-words (0, 1, 0) or (1, 0, 1), having a first bit equal to 1 and a weight greater than or equal to 7.

On the basis of these observations, four different encoding functions are specified. These are respectively $\Phi_0^+$, $\Phi_0^-$, $\Phi_1^+$, and $\Phi_1^-$ which have t following characteristics:
  the function $\Phi_0^+$ assigns the 256 8-tuples a to 256 different 14-tuples y with a weight greater than or equal to 7 in the set $L_0$.
  the function $\Phi_0^-$ assigns the 256 8-tuples a to 256 different 14-tuples y with a weight smaller than or equal to 7 in the set $L_0$.

for all the 14-tuples y with a weight equal to 7, the functions $\Phi_0^+$ and $\Phi_0^-$ are chosen so that, if the words $\Phi_0^+(a^+)$ and $\Phi_0^-(a^-)$ are all equal to a same word y, then the two words $a^+$ and $a^-$ are identical.

the function $\Phi_1^+$ assigns the 256 8-tuples a to 256 different 14-tuples y with a weight greater than or equal to 7 in the set $L_1$.

the function $\Phi_1^-$ assigns the 256 8-tuples a to 256 different 14-tuples y with a weight smaller than or equal to 7 in the set $L_1$.

for all the 14-tuples y with a weight equal to 7, the functions $\Phi_1^+$ and $\Phi_1^-$ are chosen so that if the words $\Phi_1^+(a^+)$ and $\Phi_1^-(a^-)$ are all equal to a same word y, then the two words $a^+$ and $a^-$ are identical.

The encoding function is referenced $\Phi$ and corresponds to $\Phi_0^+$, $\Phi_0^-$, $\Phi_1^+$ or $\Phi_1^-$, as a function of the current value of two parameters respectively referenced b and c. The first parameter b belongs to the set $\{0,1\}$ and is equal to the binary value of the last symbol of the last 14-tuple y transmitted previously.

The second parameter belongs to the set $\{-, +\}$ and is computed as follows: for i equal to 0 or 1, n(i) represents the number of previously transmitted symbols equal to i, and n is equal to the difference n(0)−n(1). If n is strictly positive (n>0) c is equal to +. If n is strictly negative, c is equal to −. If n is zero, c is arbitrarily equal to − or +. For values of b and c thus determined, the chosen encoding function $\Phi$ is $\Phi_c^b$.

Preferably, the complexity of the encoding is minimized according to the following rules. A coding table is determined by two tables of 256 14-tuples, $L_0^+$ and $L_0^-$:

the first 121 elements of the table $L_0^+$ are the 14-tuples with a weight equal to 7 in the set $L_0$, the last 135 14-tuples are different 14-tuples with a weight greater than or equal to eight in the set $L_0$.

the first 121 14-tuples of the table $L_0^-$ coincide with those of $L_0^+$, while its last 135 14-tuples are 135 different 14-tuples with a weight lower than or equal to 6 in the set $L_0$.

The 256 binary 8-tuples a are represented by integers a ranging from 0 to 255. The encoding of a is then performed as a function of a, b and c according to the following rules:

if b is equal to zero and c=+then a is encoded (by the function $\Phi$ equal to $\Phi_0^-$) to form the $a^{th}$ 14-tuple of $L_0^+$ (a ranges from 0 to 255 where $0 \leq a \leq 255$);

if b is equal to 0 and c=−, then a is encoded (by the function $\Phi$ equal to $\Phi_0^-$) to form the $a^{th}$ 14-tuple of $L_0^-$;

if b is equal to 1 and c=+, then a is encoded (by the function $\Phi$ equal to $\Phi_1^+$) to form the binary complement of the $a^{th}$ 14-tuple of $L_0^-$;

if b is equal to 1 and c=−, then a is encoded (by the function $\Phi$ equal to $\Phi_1^-$) to form the binary complement of the $a^{th}$ 14-tuple of $L_0^+$.

The function $\Phi$ described here above has the following properties:

when the value of n is strictly positive, this value no longer increases before it is first negative' or zero;

when the value of n is strictly below 0, this value no longer increases before it is first positive or zero;

the first bit of the word y coincides with the first bit of the next word;

except for the first and last symbol, the sequence resulting from the concatenation of the successive 14-tuples does not include any isolated symbols: the sub-sequences (0,1,0) and (1,0,1) never appear.

The receiver must recompute a piece of information a sent from a received encoded version y.

According to a first embodiment of the decoder, the memory of the decoder includes a stored table with $2^{14}$ inputs, each input being indexed with an integer i, ranging from 0 to $2^{14}-1$ and contains:

a value of a, if it exists, encoded as a 14-tuple marked by the number i; or an erasure symbol X, if the 14-tuple in the position i is not a legitimate 14-tuple produced by the encoding method.

A word y is decoded by a simple reading of the corresponding input i. If this input corresponds to a legitimate value of a, this value is considered to be the decoded value of y. Else an error is detected.

An alternative embodiment of the decoder according to the invention, necessitating less storage capacity, implements six tables of a size smaller than or equal to $2^8$ (or 256) words instead of a table sized $2^{14}$ (or 16384) words.

The decoding is then based on specific choices of the encoding function. The following notations are adopted to describe it:

We consider the following:

a 14-tuple y corresponding to a word referenced ($y_0$, $y_1$, ..., $y_{13}$) in the set $\{0,1\}$; and an 8-tuple s associated with the word (s(0), ..., s(7)) in the set $\{0,1, ... 13\}$ such that, for all the values of i ranging from 0 to 6, s(i) is strictly lower than s(i+1) (or s(i)<s(i+1)).

The word $y(s)=(y_{s(0)}, \ldots y_{s(7)})$ is defined.

We consider the 121 words y with a weight equal to 7 in the set $L_0$ and we choose the 8-tuple $s^7$ equal to (1,2,6,7,9,10,12,13). We then define a subset $L_{0,7}$ of 90 words among these 121 words y with a weight equal to 7, such that if y' and y" are two different words in the set $L_{0,7}$, then $y'(s^7)$ is different from $y"(s^7)$.

We consider the 108 words y with a weight equal to 8 or 11 in the set $L_{0,8}$ and we choose the 8-tuple $s^8$ equal to (1,3,5,6,8,9,12,13). We then define a subset $L_{0,8}$ of 89 words, among the 108 words y with a weight equal to 8 or 11, such that if y' and y" are two different words in the set $L_{0,8}$, then $y'(s^8)$ is different from $y"(s^8)$.

We consider the 59 words y with a weight equal to 9 in the set $L_0$ and we choose the 8-tuple $s_9=(1,5,6,7,9,10,12,13)$. We then define a subset $L_{0,9}$ of 52 words, among the 59 words y, such that if y' and y" are two different words in the set $L_{0,9}$, then $y'(s^9)$ is different from $y"(s^9)$.

We consider the 27 words y with a weight equal to 10 in the set $L_0$ and we choose the 8-tuple $s^{10}=(1,3,4,6,7,8,12,13)$. We then define a subset $L_{0,10}$ of 26 words, among the 27 words y having a weight equal to 10, such that if y' and y" are two different words in the set $L_{0,10}$, then $y'(s^{10})$ and $y'(s^{10})$ are different.

We consider the 117 words y with a weight equal to 6 in the set $L_0$ and we choose the 8-tuple $s^6=(1,3,4,5,7,8,12,13)$. We then define a subset $L_{0,6}$ of 26 words, among the 117 words y with a weight equal to 6, such that if y' and y" are two different words in the set $L_{0,6}$, then $y'(s^6)$ is different from $y"(s^6)$.

We consider the 141 words y with a weight 4 or 5 in the set $L_0$ and we choose the 8-tuple $s^6=(3,4,6,7,9,10,12,13)$. We then define a subset $L_{0,5}$ of 83 words, among the 141 words y with a weight equal to 4 or 5, such that if y' and y" are two different words in the set $L_{0,5}$, then $y'(s^5)$ is different from $y"(s^5)$.

The corresponding encoding method functions $\Phi$ are defined as follows.

to perform the function $\Phi$ corresponding to $\Phi_0^+$, the 90 numbers a ranging from 0 to 89 are represented by the 90 different 14-tuples in the set $L_{0,7}$;

the 89 numbers a ranging from 90 to 178 are represented by the 89 different 14-tuples in the set $L_{0,8}$;

the 52 numbers a ranging from 179 to 230 are represented by the 52 different 14-tuples in the set $L_{0,9}$; and the 25 numbers a ranging from 231 to 255 are represented by 15 different 14-tuples in the set $L_{0,10}$;

to achieve the function $\Phi$ corresponding to $\Phi_0^-$, the 90 numbers a ranging from 0 to 89 are represented by the same 14-tuples as those represented by $\Phi_0^+$; and the 89 numbers a ranging from 90 to 178 are represented by 89 different 14-tuples in the set $L_{0,6}$; and the 77 numbers a ranging from 179 to 255 are represented by 77 different 14-tuples in the set $L_{0,5}$.

to perform the function $\Phi$ corresponding to $\Phi_1^-$, the numbers a are represented by the complement of their representation as described for the function $\Phi_0^+$; and to perform the function $\Phi$ corresponding to $\Phi_1^+$, the numbers a are represented by the complement of their representation as described for the function $\Phi_0^-$.

According to these encoding rules, the decoding procedure uses six decoding tables with a size $2^8$, referenced $T_5$ to $T_{10}$.

Each of the words stored in the decoding tables $T_5$ to $T_{10}$ is represented in the form of a 9-tuple:

the ninth symbol of each 9-tuple is used to distinguish a erasure symbol referenced X, from a decoded word a: for example, if the symbol is equal to 1, the erasure symbol X is concerned; else, it is a decoded word a;

when it is a decoded word a the eight first symbols of the 9-tuple represent the corresponding word a.

For y belonging to the set $L_{0,7}$, we take $m^7(y)$ equal to the sum $$\sum_{i=0}^{7} y_s 7_{(i)} \cdot 2^i.$$

In the position m (y), the table $T_7$ contains the binary 8-tuple a, encoded in y when b (the value of the last symbol of the previously transmitted 14-tuple y) is equal to 0. In the position m, for which no value of y in the set $L_{0,7}$ meets the relationship $m=m^7(y)$, an erasure symbol X, is stored.

For y belonging to the set $L_{0,8}$, we take $m^8(y)$ to be equal to the sum $$\sum_{i=0}^{7} y_s 8_{(i)} \cdot 2^i.$$

In the position m (y), the table $T_8$ contains the binary 8-tuple a, encoded as y when b is equal to 0. In the position m, for which no value of y in the set $L_{0,8}$ meets the relationship $m=m^9(y)$, the erasure symbol X is stored.

For y belonging to the set $L_{0,10}$, we take $m^{10}(y)$ to be equal to $$\sum_{i=0}^{7} y_s 9_{(i)} \cdot 2^i.$$

In the position $m^{10}(y)$, the table $T_{10}$ contains the binary 8-tuple a, encoded as y when b is equal to 0. In the position m, for which no value of y in the set $L_{0,9}$, meets the relationship $m=m^9(y)$, the symbol of erasure X, is stored.

For y belonging to the set $L_{0,10}$, we take $m^{10}(y)$ equal to $$\sum_{i=0}^{7} y_s 10_{(i)} \cdot 2^i.$$

In the position $m^{10}(y)$, the table $T_{10}$ contains the binary 8-tuple a, encoded as y when b is equal to 0. In the position m, for which no value of y in the set $L_{0,10}$ meets the relationship $m=m^{10}(y)$, the erasure symbol X, is memorized.

For y belonging to the set $L_{0,6}$, $m^6(y)$ is $$\sum_{i=0}^{7} y_s 6_{(i)} \cdot 2^i.$$

In the position m (y), the table $T_6$ contains the binary 8-tuple a, encoded as y when b is equal to 0. In the position m, for which no value of y in the set $L_{0,6}$ meets the relationship $m=m^{10}(y)$, the erasure symbol X, is memorized.

For y belonging to the set $L_{0,5}$, $m^5(y)$ is $$\sum_{i=0}^{7} y_s 5_{(i)} \cdot 2^i.$$

In the position $m^5(y)$, the table $T_5$ contains the binary 8-tuple a, encoded as y when b is equal to 0. In the position m, for which no value of y in the set $L_{0,5}$, meets the relationship $m=m^5(y)$, the erasure symbol X, is memorized.

When a 14-tuple y is received with a first bit equal to 0, its weight w is computed. If the weight w is equal to 4 or 11, then it is reset at 5 or 8 respectively. If the weight w is lower than or equal to 3 or greater than or equal to 12, then a transmission error is detected. If no error is detected, the decoder reads the table $T_w$ at the position $m^w(y)$. If a mark of erasure X, is read, a transmission error is also detected. Else, the content of the table $T_w$ at the position $m^w(y)$ is an estimation of the information transmitted a.

When a 14-tuple y is received with a first bit equal to 1, the 14-tuple y is first of all replaced by its binary complement and then decoded as if its first bit were equal to 0.

Referring now to FIG. 1, we present a system according the invention comprising a sending block 11 and a reception block 14 connected by a cable 13 of the CAT-5 UTP type ("Unshielded Twisted Pair, Category 5" type according to the ANSI/TIA/EIA/568A standard), the data being transmitted on the cable 13 so as to comply with the standards for the transmission of parasitic frequencies.

This type of cable is conventionally used in Ethernet type networks and is particularly well suited to the invention.

Other wire transmission media are used in variants of the invention.

The sending block 11 comprises:
- any information source 10 (for example a multimedia source); and
- an encoder 12 encoding the data sent by the source 10 for example in the form of bits, grouped together in symbols, and sending them on the cable 13.

The reception block 14 comprises:
- a decoder 15 adapted to receiving and decoding the data encoded by the encoder 12 and sent on the cable 13; and
- a recipient of the data decoded by the decoder 15 and signals, if any, called addressee 16, indicating a transmission detected by the decoder 15.

This encoder 12 encodes the data so as to transmit a signal whose DC component is appreciably zero for each transmitted symbol, and never has two successive transitions during transmission.

Figure 2:
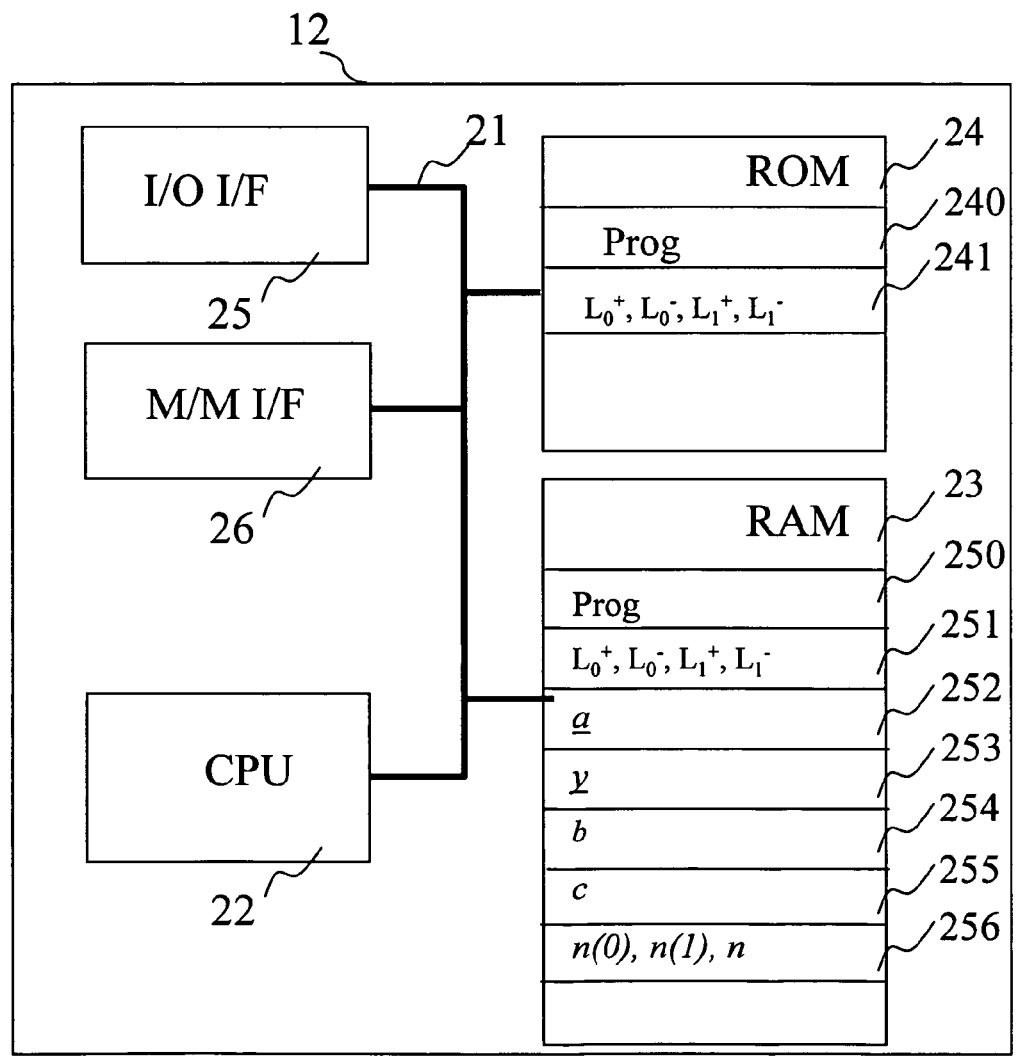
FIGS. 2 and 7 respectively illustrate a device forming an encoder and a device forming a decoder, belonging to the system presented in FIG. 1.

FIG. 2 diagrammatically illustrates a device corresponding to the encoder 12 as illustrated with reference to FIG. 1.

The encoder 12 includes the following, connected to each other through an address and data bus 21:
- a processor 22;
- a random access memory 23;
- a read-only memory 24;
- an input/output interface 25; and
- a man/machine interface 26.

Each of the elements illustrated in FIG. 2 is well known to those skilled in the art. These common elements are not described herein.

It should be noted that, in the description below, for each of the memories mentioned, the word "register" used in the entire description may equally well denote a small-capacity memory area (comprising a few pieces of binary data), or a large-capacity memory area (capable of storing an entire program or an entire set of transmitted or received words).

The non-volatile memory 24 keeps the following in registers which, for the sake of convenience, have the same names as the data that they contain:
- the operating program of the processor 22 in a register <<Prog>>240; and
- the previously described sets $L_0^-$, $L_0^+$, $L_1^-$ and $L_1^+$ in a register 241.

Figure 4:
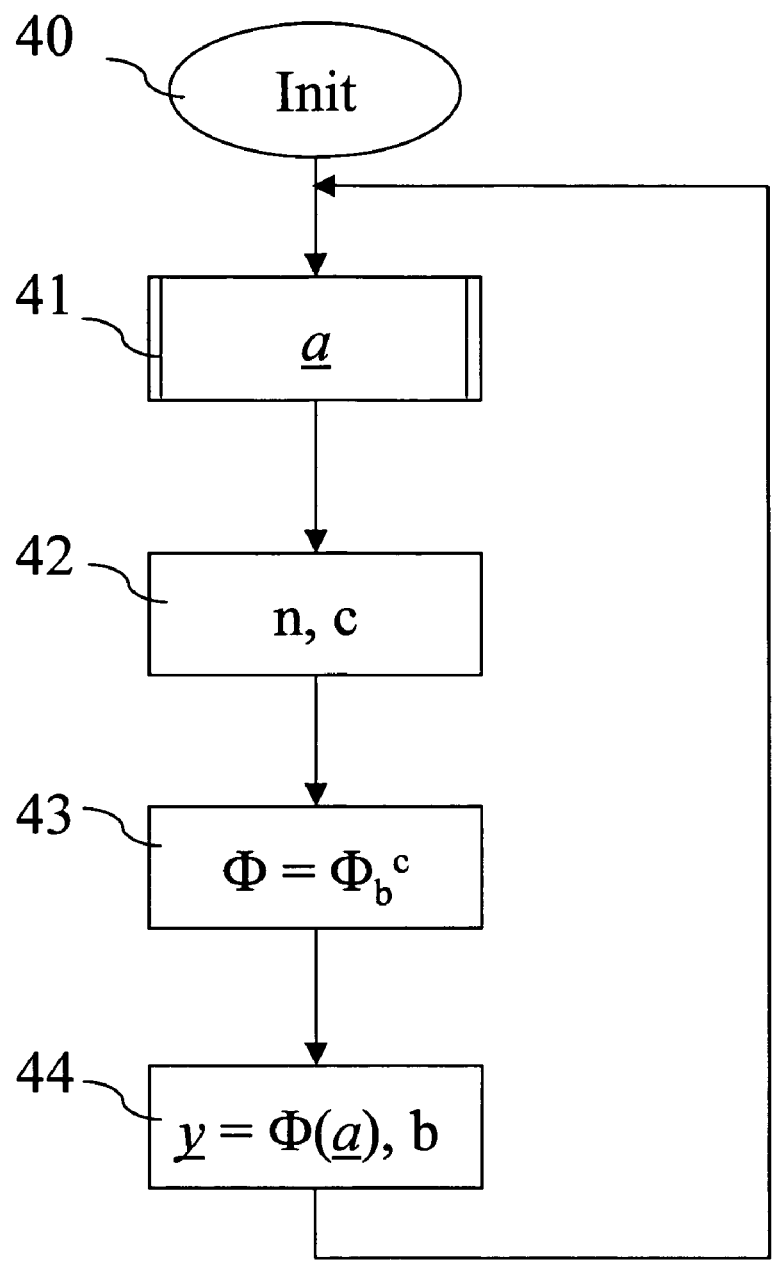
FIG. 4 describes an encoding algorithm implemented in the encoder illustrated with reference to FIG. 2.

The algorithms that implement the steps of the methods described below, particularly with reference to FIG. 4, are stored in the non-volatile memory 24 associated with the encoder 12 implementing steps of these algorithms.

When the system is powered on, the processor 22 loads and executes the instructions of these algorithms (associated especially with the program 240) as well as the content of the register 241.

The random-access memory 23 keeps data, variables and intermediate processing results and includes in particular:
- the operating program <<prog>>250 of the processor 22 loaded when the encoder 12 is powered on;
- variables of operation of the program 250, especially:
  - the sets $L_0^-$, $L_0^+$, $L_1^-$ and $L_1^+$ in a register 251 and also loaded when the encoder 12 is powered on;
  - a word a to be encoded in a register 252;
  - an encoded word y to be encoded in a register 253;
  - a binary element of value b equal to the value of the last symbol of the last 14-tuple y previously transmitted in a register 254;
  - a value of the parameter c described here above in a register 255; and
  - the values of the parameters n(0), n(1) and n described here above in a register 256.

FIG. 3 gives a view, by way of an illustration, of the table $L_0^+$(14-tuples with a weight equal to 7 in the set $L_0$) stored in the register 251.

For each input a whose rank ranging from 0 to 255 is shown, this table comprises the value of the corresponding 14-tuple of $L_0^+$ determined according to the rules illustrated here above.

FIG. 4 describes an encoding algorithm implemented in the encoder 12 illustrated with reference to FIGS. 1 and 2.

The encoding algorithm starts with a step 40 used to initialize the different variables used by the algorithm, and especially the variable b arbitrarily set at 0 and the variables n(0) and n(1) equal to 0.

Then, the encoder 12 goes into standby and receives, from the source 10, a word a during a step 41.

Then, during a step 42, the encoder 12 computes n(0) and n(1) (n(i) represents the number of previously transmitted symbols equal to i), and n is equal to the difference n(0)−n(1). During the step 42, the encoder 12 also computes the parameter c as a function of the sign of n as indicated here above.

Then, during a step 43, the encoder 12 computes the function $\Phi$ according to b and c, the chosen encoding function $\Phi$ being $\Phi_c^b$.

Finally, during a step 44, the encoder 12 determines the encoded word y equal to $\Phi_c^b(a)$ in reading the input corresponding to the word a in the table $L_c^b$ stored in the register 251. This word y is then sent on the cable 13. At the same time, the parameter b is determined (b is equal to the value of the last binary element of the word y).

The step 41 is then reiterated.

Figure 7:
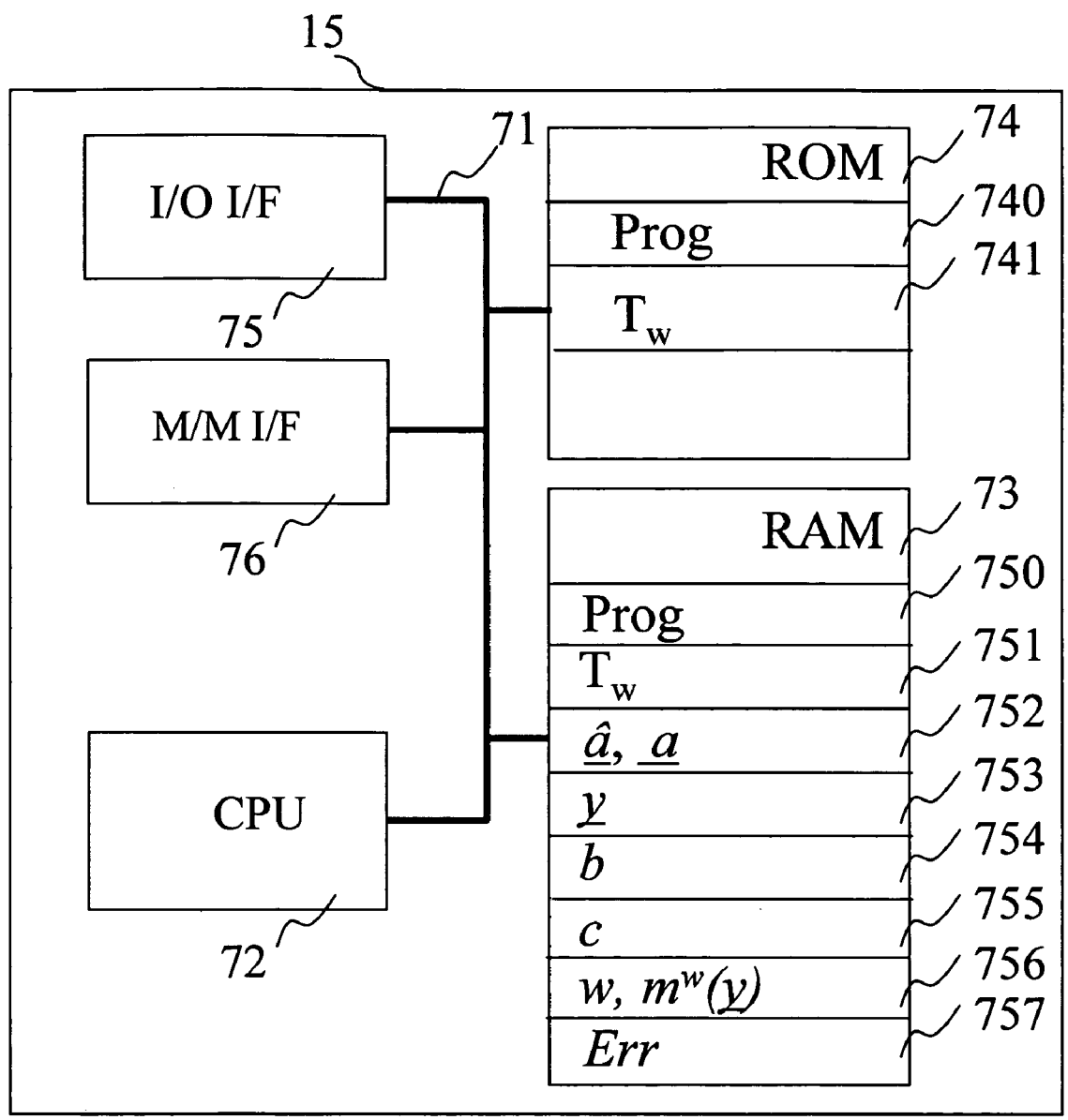

FIG. 7 diagrammatically illustrates a device corresponding to the decoder 15 as illustrated with reference to FIG. 1.

The decoder 15 includes the following, connected to each other through an address and data bus 71:
- a processor 72;
- a random access memory 73;
- a read-only memory 74;
- an input/output interface 75; and
- a man/machine interface 76.

Each of the elements illustrated in FIG. 7 is well known to those skilled in the art. These common elements are not described herein.

The non-volatile memory 74 keeps the following in registers which, for the sake of convenience, have the same names as the data that they contain:
- the operating program of the processor 72 in a register <<Prog>>740; and
- the previously described tables $T_w$ in a register 741.

Figure 6:
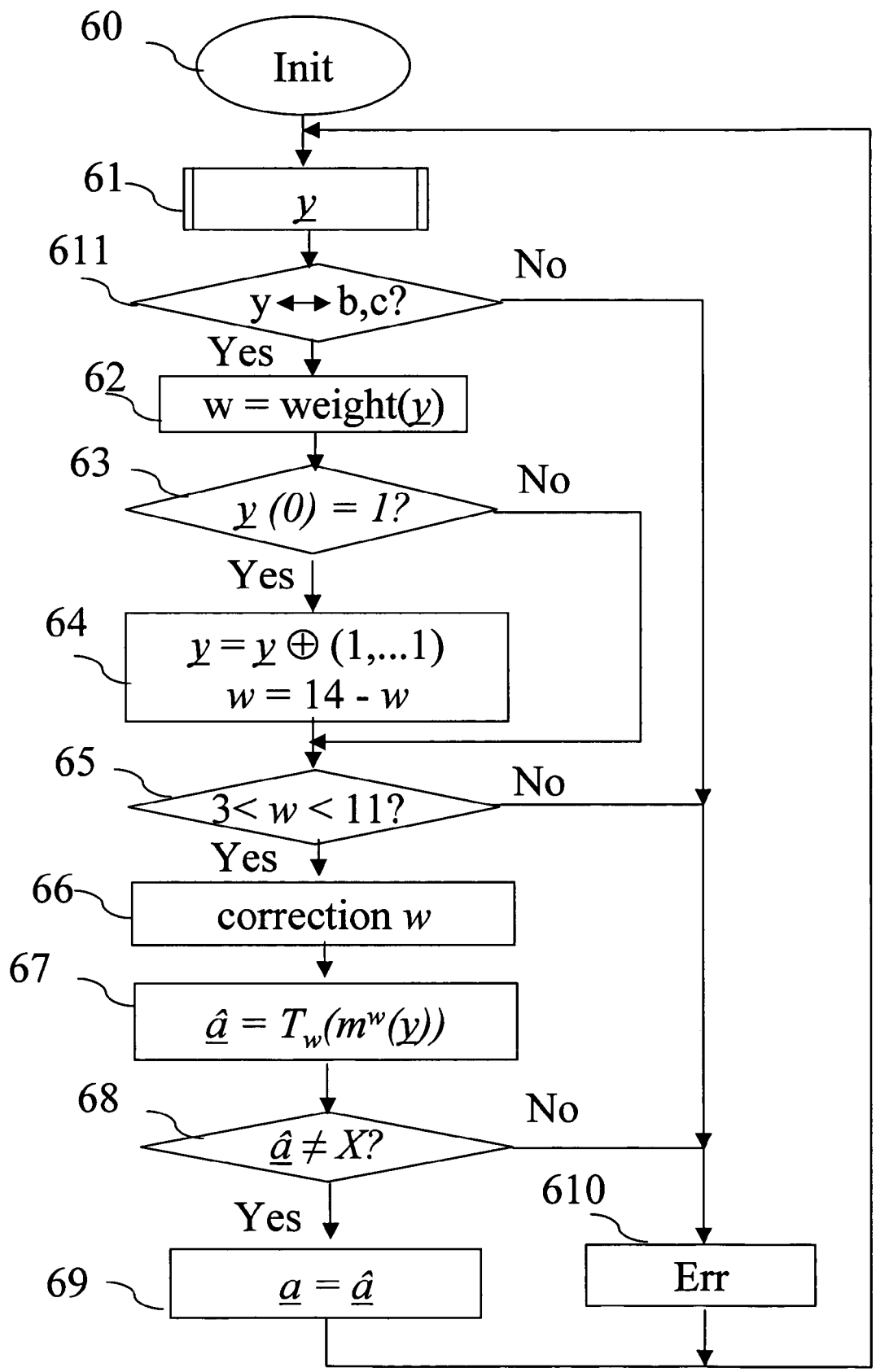
FIG. 6 illustrates a decoding algorithm implemented in the decoder presented with reference to FIG. 7.

The algorithms that implement the steps of the methods described below, particularly with reference to FIG. 6, are stored in the non-volatile memory 74 associated with the decoder 15 implementing the steps of these algorithms.

When the system is powered on, the processor 72 loads and executes the instructions of these algorithms (associated especially with the program 740) as well as the content of the register 741.

The random-access memory 73 keeps data, variables and intermediate processing results and includes in particular:
- the operating program <<prog>>750 of the processor 72 loaded when the decoder 15 is powered on;
- variables of operation of the program 750, especially:
  - the tables $T_w$ in a register 751 also loaded when the decoder 15 is powered on;

an estimation â of the word a transmitted in a register 752;

a received wordy to be decoded in a register 753;

a binary element of value b equal to the value of the last symbol of the last 14-tuple y previously received in a register 754;

a value of the parameter c described previously in a register 755;

the values of the parameters w and $m^w(y)$ in a register 756; and an indication of error Err in a register 757.

FIG. 6 describes the decoding algorithm implemented in the decoder 15 illustrated with reference to FIGS. 1 and 7.

The decoding algorithm starts with a step 60 for initializing the different variables used by the algorithm.

Then the decoder 15 goes into standby and then receives a word y to be decoded from the sending block 11 in a step 61.

Then, during a test 611, the decoder 15 verifies the consistency of the received word y with any words y that have already been received and belong to the current sequence.

More specifically, the last symbol of the preceding word y in the current sequence must be the same as the first symbol of the word y processed according to the choice of the encoding function φ determined as a function of the parameter b described here above. If, during the test 611, the decoder 15 detects an inconsistency in this aspect, then a reception error is detected and, during an error processing step 610, a corresponding error signal is generated. The current word y is then set aside along with the result corresponding to the decoding of the word y previously received.

During the test 611, the consistency of the weights of the words y received is also verified. For i equal to 0 or 1, n(i) represents the number of previously received symbols equal to i, and n is equal to the difference n(0)−n(1). If n is strictly negative, then the weight of the current sequence must be greater than or equal to 7, according to the choice of the encoding function φ determined as a function of the parameter c described here above. If n is strictly positive, then the weight of the current sequence must be lower than or equal to 7. If, during the test 611, the decoder 15 detects an inconsistency in the weights of the sequence of received words, a reception error is detected and, during the error-processing step 610, a corresponding error signal is generated and the current word y is set aside along with the result corresponding to the decoding of the words y previously received and belonging to the sequence y.

According to one alternative embodiment of the invention, only the current wordy is set aside during the step 610 if an inconsistency is detected.

Then, if the consistency of the words y received in the current sequence is verified during the test 611, then during a step 62, the decoder 15 computes the weight w of the received wordy.

Then, during a step 63, the decoder determines whether the first bit of the received word y is 0 or 1.

If the first bit of the word y is 1, then, during a step 64, the decoder 15 replaces the word by its complement (the 0 bits are changed into 1 and vice-versa) and the decoder computes the corresponding weight w of y, for example by deducting the current value of w from 14 (w=14−w).

Following the step 64 or if the first bit of the word y is equal to 0 during the step 63, then during a test 65, the decoder 15 verifies that the computed weight w is strictly between 3 and 11.

If the answer is negative, a reception error is detected and, during the error processing step 610, a corresponding error signal is generated and processed according to techniques (such as requesting retransmission, erasing the wrongly received word etc.) well known to those skilled in the art.

If the answer is affirmative, the computed weight w has a value consistent with the encoding algorithm and, during a step 66, the decoder 15 corrects the parameter w if it is equal to 4 or 11:

if the weight w is equal to 4, the value of w is incremented by one unit;

if the weight w is equal to 11, then the value of w becomes 8;

else the value w keeps its true weight value.

Then, during a step 67, the decoder 15 determines an estimation â of the decoded word as a function of the value of w and of y: the decoder 15 computes firstly $m^w$ corresponding to the sum $$\sum_{i=0}^{w-1} y_{s^w(i)} \cdot 2^i$$

then reads the content of the corresponding word in the table 751 $T_w$:

$$â = T_w(m^w(y))$$

Then, during a test 68, the decoder 15 verifies that the value of the mot â thus determined corresponds to a value different from the erasure sequence X.

If the answer is negative, the value read in the table $T_w$ is an erasure value and the decoder 15 performs the error-processing step 610.

If the answer is affirmative then, during a step 69, the decoder 15 gives the addressee 16 a word a as a function of the result of the test 63 and corresponding to the word a determined during the step 67.

After the steps 610 and 69, the step 61 of waiting for a wordy is reiterated.

In different decoding variants, no test is conducted to verify the validity of the received words or these tests are conducted only in part.

Figure 5:
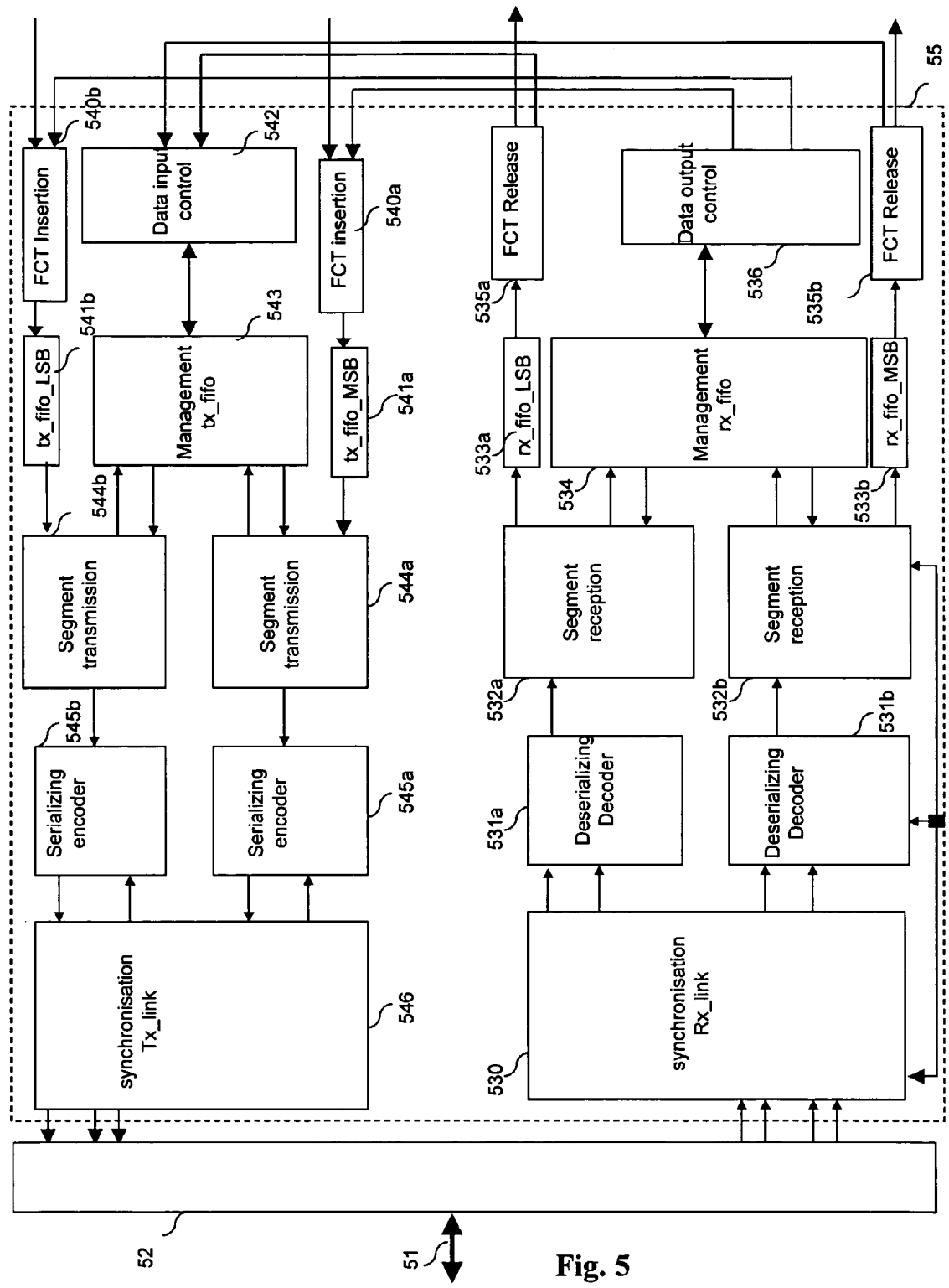
FIG. 5 is a block diagram of an interface for a system implementing the encoding and decoding algorithms illustrated in FIGS. 4 and 6, according to an alternative embodiment of the invention.

FIG. 5 is a block diagram of a UTP5 type link interface for a system using the encoding and decoding method described in FIGS. 3 and 4, particularly within a communication network for connecting several items of equipment in a home network for example.

The data transmission, which may be in different formats, is carried out in particular through adapted cables or links, especially for applications in a home environment. Thus, the devices that process digital data may operate according to the IEEE-1394 standard.

According to one particular embodiment, the data is transmitted by means of a CAT5 type cable composed of four twisted wire pairs, two pairs being dedicated to the sending of encoded information and two pairs being dedicated to the reception of information. This type of cable is conventionally used in Ethernet type networks and is particularly well suited to the invention. Out of the two transmission pairs dedicated to sending (or reception), one pair transmits segments containing most significant bits of the information bytes sent by the sending devices, and the other pair transmits segments containing least significant bits of the information bytes sent by the sending devices.

The UTP5 link interface is connected to a transmission medium 51 as described previously.

It may be noted that it is possible to use other wire media, such as cables complying with the IEEE-1355 standard.

The link between the UTP5 link interface and the medium 51 is set up by means of a physical interface module 52, not described in this document.

This physical interface module 52 is connected to a reception synchronization block 530 that determines the binary value associated with each period of the signal received on a pair. It furthermore determines the start of the segment and informs the de-serialization/decoding block 531a and 531b of the binary value associated with each signal period received on the corresponding reception pair.

It must be noted that the data reaches the synchronization block 530 in the form of two signals. Indeed, the data is divided into two parts: a first part for the most significant bits is received on one pair of wires and a second part for the least significant bits is received on another pair of wires.

Thus the synchronization block 530 gives each de-serialization/decoding block a synchronization clock signal determined from the signal received. It also determines the binary value of the signal for each of these periods.

The de-serialization/decoding blocks 531a and 531b will decode the data received using the decoding method presented in FIG. 6, and will then parallelize the data decoded, i.e. place each of the pieces of data on eight bits.

When the data is decoded and parallelized, the segments containing the most significant bits are transferred to the segment reception block 532b and the segments containing the least significant bits are transferred to the segment reception block 532a.

These blocks 532a and 532b will rebuild the segments received and furthermore verify that the received segment is correct by carrying out, for example, a classic parity check on the received data.

When this check is made, the block 532b transfers the reconstructed most significant segment to a FIFO type storage means or memory 533b. It also generates an information signal, intended for the FIFO control module 534, on the presence of a new segment.

The block 532a performs the same operations as the block 532b but does so for the segments containing the least significant bits. This block shall not be described in greater detail.

The reception FIFO control module 534 informs the data output control module 536 about the reception of the totality of a segment, the segment comprising both the least significant bytes stored in the FIFO 533a (rx_fifo_LSB) and the most significant bytes stored in the FIFO 533b (rx_fifo_MSB).

There are three output memories connected through a bus 56a (MUX Bus), and three input memories connected through a bus 56b (DEMUX Bus), associated with the UTP5 link interface.

These memories are controlled by a FIFO control module. The data output control module 536 informs the FIFO control module of the reception of a new segment.

The module 536 manages the insertion of the credit characters by the modules 540a and 540b as a function of the read operations on the storage means 533a and 533b.

The FIFO control module then makes a read request to read the data received through the credit analysis modules 535a and 535b.

The credit analysis modules 535a and 535b respectively extract, firstly, the information representing the FIFO memory or recipient buffer and, secondly, the information representing a release of credit in a FIFO memory or remote reception buffer.

When the credit analysis modules 535a and 535b respectively identify a destination buffer, the information is transmitted through a control signal to a FIFO control module so that this control module will select the input FIFO (three output memories) to which the data will be transferred.

When the credit analysis modules 535a and 535b respectively identify a credit release, the information is transmitted through a control signal to the data-sending module 542.

The data-sending module 542, manages the method of segmentation for the transmission of the packets from each of the output FIFOs (three output memories). The transfer of data from one of the output FIFOs firstly to the FIFO 541a for sending most significant bytes (tx_FIFO_MSB) and secondly to the FIFO 541b for sending least significant bytes (tx_FIFO_LSB) is done through the credit insertion modules 540a for the least significant values and 540b for the most significant values.

Firstly, through control signals, the data-sending module 542 receives credit release information coming from the credit analysis module 535a and 535b respectively.

Secondly, the data-sending module 542 receives read requests for reading the output FIFOs, coming from a FIFO control module.

Furthermore, the FIFO control module notifies the credit insertion module 540, when a predetermined number of pieces of data has been read in one of the input FIFOs. The credit insertion modules 540a and 540b respectively then insert a piece of information into the segment, this piece of information representing a release of credit associated with one of the input FIFOs.

The FIFO sending control module 543 notifies the data-sending module 542 of the sending of the totality of a segment, the segment comprising both the least significant bytes stored in the FIFO 541b (tx_FIFO_LSB) and the most significant bytes stored in the FIFO 541a (tx_FIFO_MSB).

The blocks 544a and 544b will transmit the segments by computing the parity control field associated with the segment. They therefore inform the FIFO sending control module 543 of the end of transmission of each part of the (respectively least significant and most significant) segment.

The blocks 545a and 545b will encode the segments as described in FIG. 3 and will make byte-by-byte transmission of each segment in the form of a binary string through the sending synchronization block 546. The sending synchronization block 546 is chiefly in charge of generating a synchronization signal at the head of a segment.

Naturally, the invention is not limited to the embodiments mentioned here above.

In particular, those skilled in the art will be able to provide any variant in the length of the word to be encoded and of the encoded word.

It will be noted that the encoding is not limited to an encoding that implements four elementary encoding functions but can be extended to any encoding that distinguishes at least two elementary encoding functions depending on previously encoded words and on the contents of the word to be encoded.

Similarly, the decoding of the codes obtained by an encoding that implements elementary encoding operations as a function of the previously encoded words and of the contents of the word to be encoded is implemented, according to the invention, according to the complexity sought: if the memory capacity is not limited, the decoder can carry out a direct reading in full decoding tables including the correspondence between code words and decoded words; if, on the contrary, it is necessary to economize on memory, the decoding is simplified, for example in taking account of possible symmetries between a decoded word and its complement and/or the weight of the code word received and/or any other parameter enabling fast and simple decoding.

It will be noted that the invention is not limited to a purely hardware layout but can also be implemented in the form of a sequence of instructions of a computer program or in any form combining a hardware part and a software part. Should the invention be installed partially or totally in software form, the corresponding sequence of instructions may or may not be stored in a detachable storage means (such as for example a floppy disk, a CD-ROM or a DVD-ROM), this storage means being partially or totally readable by a computer or a microprocessor.

What is claimed is:

1. A method for encoding a sequence of source words, the method comprising:
   a step of selecting an encoding function to be applied to a source word to be encoded as a function of the content of the word to be encoded and of at least one preceding source word in the sequence so that the concatenation of two consecutive encoded words has no isolated binary element-between two binary elements with a value different from that of the isolated binary element; and
   a step of encoding the word to be encoded implementing the selected encoding function.

2. A method according to claim 1, wherein said step of encoding the word to be encoded produces an encoded word with a fixed length as a function of the length of the word to be encoded.

3. A method according to claim 1, wherein said step of selecting an encoding function takes account of the binary element of a last encoded word, a first binary element of the result of the application of the encoding function to the source sequence to be encoded being equal to the binary element of the last encoded word.

4. A method according to claim 3, further comprising a step of storing the last binary element of the last encoded word.

5. A method according to claim 1, further comprising a step of computing a difference between a number of binary elements associated with a first binary value and a number of binary elements associated with a second binary value, the binary elements belonging to a set of previously encoded words,
   said step of selecting an encoding function taking account of the result of the computation so as to approximately balance the number of binary elements respectively associated with the first and second binary values, and the binary elements belonging to a set of words encoded after application of the encoding function.

6. A method according to claim 5, wherein said step of selecting an encoding function takes account of the sign of the difference.

7. A method according to claim 6, wherein the application of the encoding function, selected during said selecting step, to the source word to be encoded:
   contains at least as many elements corresponding to the first binary value as elements corresponding to the said second binary value if the difference is strictly negative; and
   contains at most as many elements corresponding to the first binary value as elements corresponding to the second binary value if the difference is strictly positive.

8. A method according to claim 1, wherein said step of selecting an encoding function comprises selecting an encoding function from among:
   a first predetermined encoding function having a result that is an encoded sequence with a mean weight greater than or equal to half the number of elements of the encoded word, and having a first element that has a first binary value representing 0;
   a second predetermined encoding function having a result that is an encoded word with a weight lower than or equal to the mean weight, and having a first element that possesses a first binary value representing 0;
   a third predetermined encoding function having a result that is an encoded word with a weight greater than or equal to the mean weight, and having a first element that has a first binary value representing 1; and
   a fourth predetermined encoding function having a result that is an encoded word with a weight lower than or equal to the mean weight, and having a first element that has a first binary value representing 1.

9. A method according to claim 8, wherein the first and second encoding functions coincide when each of the first and second encoding functions produces encoded words with a weight equal to the mean weight; and
   wherein the third and fourth functions coincide when each of the third and fourth functions produces encoded words with a weight equal to the mean weight.

10. A method according to claim 8, further comprising:
    a step of storing a first encoding table associated with the first encoding function and a second encoding table associated with the second encoding function; and
    a step of reading an encoded sequence in one of the encoding tables associated with the selected encoding function if one of the first or second encoding functions is selected.

11. A method according to claim 1, wherein at least one of the encoding functions comprises a step of determining a binary complement of the word to be encoded.

12. A method for decoding a sequence of binary encoded words, wherein the sequence does not possess an isolated binary element between two binary elements having a value different from that of the isolated binary element, and wherein the decoding method comprises:
    a step of decoding each of the binary encoded words, the binary encoded words being decoded separately, and, for each of the binary encoded words:
       a step of reading a decoded word in a decoding table at a location that is a function of the encoded word; and
       a step of verifying the validity of the decoded word as a function of the result of said reading step.

13. A method according to claim 12, wherein all of the binary encoded words have the same determined length.

14. A method according to claim 12, further comprising, for each of the binary encoded words, a step of verifying the validity of the received word as a function of the words of the sequence, previously received.

15. A method according to claim 12, further comprising, for each of the binary encoded words, a step of selecting a decoding function to be applied to the binary encoded word as a function of content of the encoded word.

16. A method according to claim 15, wherein said selecting step comprises a sub-step of extracting a sub-word of the binary encoded word.

17. A method according to claim 16, further comprising:
a sub-step of determining the weight of the encoded binary word; and
wherein said sub-step of extracting the sub-sequence comprises determining the positions of the binary elements extracted from the binary encoded word as a function of the weight.

18. A method according to claim 17, further comprising:
a step of computing a linear combination of the binary elements of the sub-word; and
a step of reading a decoding table as a function of the linear combination.

19. A method according to claim 12, further comprising, for each of the binary encoded words:
a step of identifying the first binary element of the binary encoded word;
and a step of computing the binary complement of the binary encoded word if the first binary element corresponds to a predetermined value.

20. A method according to claim 12, further comprising, for each of the binary encoded words, a step of checking the validity of the encoded word as a function of the weight of the encoded word.

21. A device for encoding a sequence of source words, the device comprising:
a device configured to select an encoding function to be applied to a source word to be encoded as a function of the content of the word to be encoded and of at least one preceding source word in the sequence so that the concatenation of two consecutive encoded words has no isolated binary element between two binary elements that have a value different from that of the isolated binary element; and
a device configured to encode the word to be encoded implementing the selected encoding function.

22. A device for decoding a sequence of binary encoded words, wherein the sequence does not possess an isolated binary element between two binary elements that have a value different from that of the isolated binary element and wherein the device comprises:
a decoder adapted to decode each of the binary encoded words, the binary encoded words being decoded separately, and, for each of the binary encoded words:
a reader adapted to read a decoded word in a decoding table at a location that is a function of the encoded word; and
a validator adapted to verify the validity of the decoded word as a function of the result of said reader.

23. A computer program product adapted to the encoding of a sequence of source words,
said computer program product comprising program code instructions recorded on a readable medium that can be used in a computer comprising:
programming means readable by computer to perform a step of selecting an encoding function to be applied to a source word to be encoded as a function of the content of the word to be encoded and of at least one preceding source word in the sequence so that the concatenation of two consecutive encoded words has no isolated binary element between two binary elements with a value different from that of the isolated binary element, and
programming means readable by computer to perform a step of encoding the word to be encoded implementing the selected encoding function.

24. A computer program product adapted to the decoding of a sequence of binary encoded words,
said sequence possessing no isolated binary element between two binary elements having a value different from that of the isolated binary element,
said computer program product comprising program code instructions recorded on a readable medium that can be used in a computer comprising:
programming means readable by computer to perform:
a step of decoding each of the binary encoded words, the binary encoded words being decoded separately, and, for each of the binary encoded words:
a step of reading a decoded word in a decoding table at a location that is a function of the encoded word; and
a step of verifying the validity of the decoded word as a function of the result of the reading step.

25. A computer readable storage medium, which is totally or partially removable, storing a set of machine executable instructions, said instructions being executable by a computer adapted to the encoding of a sequence of source words to perform:
a step of selecting an encoding function to be applied to a source word to be encoded as a function of the content of the word to be encoded and of at least one preceding source word in the sequence so that the concatenation of two consecutive encoded words has no isolated binary element between two binary elements with a value different from that of the isolated binary element, and
a step of encoding the word to be encoded implementing the selected encoding function.

26. A computer readable storage medium, which is totally or partially removable, storing a set of machine executable instructions, said instructions being executable by a computer adapted to the decoding of a sequence of binary encoded words, the sequence possessing no isolated binary element between two binary elements having a value different from that of the isolated binary element, to perform:
a step of decoding each of the binary encoded words, the binary encoded words being decoded separately, and, for each of the binary encoded words:
a step of reading a decoded word in a decoding table at a location that is a function of the encoded word; and
a step of verifying the validity of the decoded word as a function of the result of the reading step.

* * * * *

UNITED STATES PATENT AND TRADEMARK OFFICE
CERTIFICATE OF CORRECTION

PATENT NO. : 7,256,717 B2
APPLICATION NO. : 11/179623
DATED : August 14, 2007
INVENTOR(S) : Philippe Piret et al.

It is certified that error appears in the above-identified patent and that said Letters Patent is hereby corrected as shown below:

COLUMN 1:

Line 10, "telecommunications" should read --telecommunications.--.

COLUMN 2:

Line 55, "word" should read --words--.

COLUMN 5:

Line 2, "comprises," should read --comprises--.

COLUMN 7:

Line 30, "wordy" should read --word y--.

COLUMN 9:

Line 43, "c=+then" should read --c=+, then--; and
Line 57, "negative'" should read --negative--.

COLUMN 10:

Line 42, "$s_9$" should read --$s^9$--; and
Line 59, "$s^{6-}$" should read --$s^5$--.

COLUMN 11:

Line 33, "a" should read --an--;
Line 64, "m(y)," should read --$m^8(y)$,--; and
Line 67, "$m=m^9(y)$," should read --$m=m^8(y)$,--.

COLUMN 12:

Line 1, "$L_{0,10}$, we take $m^{10}(y)$" should read --$L_{0,9}$, we take $m^9(y)$--;
Line 8, "$m^{10}(y)$, the table $T_{10}$" should read --$m^9(y)$, the table $T_9$--;
Line 31, "m(y)" should read --$m^6(y)$,--;
Line 34, "$m=m^{10}(y)$," should read --$m=m^6(y)$,--;
Line 44, "$L_{0,5}$," should read --$L_{0,5}$--; and
Line 60, "the" should read --to the--.

UNITED STATES PATENT AND TRADEMARK OFFICE
CERTIFICATE OF CORRECTION

PATENT NO. : 7,256,717 B2
APPLICATION NO. : 11/179623
DATED : August 14, 2007
INVENTOR(S) : Philippe Piret et al.

It is certified that error appears in the above-identified patent and that said Letters Patent is hereby corrected as shown below:

<u>COLUMN 15</u>:

Line 3, "wordy" should read --word y--;
    Line 51, "wordy" should read --word y--; and
    Line 56, "wordy." should read --word y.--.

<u>COLUMN 16</u>:

Line 31, "the mot" should be deleted;
    Line 41, "wordy" should read --word y--.

<u>COLUMN 19</u>:

Line 27, "element-between" should read --element between--.

Signed and Sealed this

Twenty-third Day of September, 2008

JON W. DUDAS
*Director of the United States Patent and Trademark Office*